(12) United States Patent
Chien et al.

(10) Patent No.: US 6,742,078 B1
(45) Date of Patent: May 25, 2004

(54) MANAGEMENT, DATA LINK STRUCTURE AND CALCULATING METHOD FOR FLASH MEMORY

(75) Inventors: Cheng-Chih Chien, Taichung (TW); Chin-Chen Lee, Taipei Hsien (TW); Khein Seng Pua, Selangor D.E. (MY); Soo Ching Ng, Selangor D.E. (MY); Jiunn-Yeong Yang, Keelong (TW)

(73) Assignee: Feiya Technology Corp., Hsin-chu (TW)

( * ) Notice: Subject to any disclaimer, the term of this patent is extended or adjusted under 35 U.S.C. 154(b) by 0 days.

(21) Appl. No.: 09/412,323

(22) Filed: Oct. 5, 1999

(51) Int. Cl.[7] ............................................. G06F 12/00
(52) U.S. Cl. .................. 711/103; 711/165; 365/185.11; 714/8; 714/718
(58) Field of Search .................. 711/103, 165, 711/216, 111; 365/185.11; 714/718, 6, 8, 15

(56) References Cited

U.S. PATENT DOCUMENTS

| | | | | |
|---|---|---|---|---|
| 5,283,790 A | * | 2/1994 | Kawashita ..................... | 714/7 |
| 5,630,093 A | * | 5/1997 | Holzhammer et al. ....... | 711/115 |
| 5,898,868 A | * | 4/1999 | Krueger et al. .............. | 707/205 |
| 5,978,808 A | * | 11/1999 | Wells et al. ................. | 707/100 |
| 6,212,097 B1 | * | 4/2001 | Kihara et al. ........... | 365/185.04 |
| 6,237,110 B1 | * | 5/2001 | Lin et al. ..................... | 711/103 |
| 6,360,293 B1 | * | 3/2002 | Unno ......................... | 711/103 |
| 6,412,080 B1 | * | 6/2002 | Fleming et al. ............. | 711/103 |
| 6,412,089 B1 | * | 6/2002 | Lenny et al. ................ | 714/718 |
| 6,427,186 B1 | * | 7/2002 | Lin et al. ..................... | 711/103 |
| 6,477,616 B1 | * | 11/2002 | Takahashi .................... | 711/111 |
| 6,535,995 B1 | * | 3/2003 | Dobbek .......................... | 714/8 |

* cited by examiner

*Primary Examiner*—Pierre-Michel Bataille
(74) *Attorney, Agent, or Firm*—Rabin & Berdo, P.C.

(57) ABSTRACT

The present invention relates to a management and link structure of a flash memory. The flash memory is divided into several different types of data access blocks, such as general data blocks, spare blocks, link-table block, and new blocks. A simple data link structure is provided, and a management and calculating method for spare blocks saves time to search and write data effectively and prolongs the service life of the flash memory.

5 Claims, 20 Drawing Sheets

| The Capacity of Flash Memory | Total Block | General Data Block | Spare Block | Link Table Block | New Block | Reserved |
|---|---|---|---|---|---|---|
| 2M/4M | 512 | 0~495 | 496~502 | 503 | 504~510 | 511 |
| 8M | 1024 | 0~991 | 992~1006 | 1007 | 1008~1022 | 1023 |

Fig. 1

|  | Data Region | Spare Region (16 Byte) | | |
|---|---|---|---|---|
|  | 0~511 | 512~519 | 520~523 | 524~527 |
| Page 0 | Data written by mainframe | Error Control Code | ID Code | Reserved |
| Page 1 | Data written by mainframe | Error Control Code | ID Code | Reserved |
| Page 2 | Data written by mainframe | Error Control Code | ID Code | Reserved |
| Page 3 | Data written by mainframe | Error Control Code | ID Code | Reserved |
| Page 4 | Data written by mainframe | Error Control Code | ID Code | Reserved |
| Page 5 | Data written by mainframe | Error Control Code | ID Code | Reserved |
| Page 6 | Data written by mainframe | Error Control Code | ID Code | Reserved |
| Page 7 | Data written by mainframe | Error Control Code | ID Code | Reserved |
| Page 8 | Data written by mainframe | Error Control Code | ID Code | Reserved |
| Page 9 | Data written by mainframe | Error Control Code | ID Code | Reserved |
| Page 10 | Data written by mainframe | Error Control Code | ID Code | Reserved |
| Page 11 | Data written by mainframe | Error Control Code | ID Code | Reserved |
| Page 12 | Data written by mainframe | Error Control Code | ID Code | Reserved |
| Page 13 | Data written by mainframe | Error Control Code | ID Code | Reserved |
| Page 14 | Data written by mainframe | Error Control Code | ID Code | Reserved |
| Page 15 | Data written by mainframe | Error Control Code | ID Code | Reserved |

Fig. 5

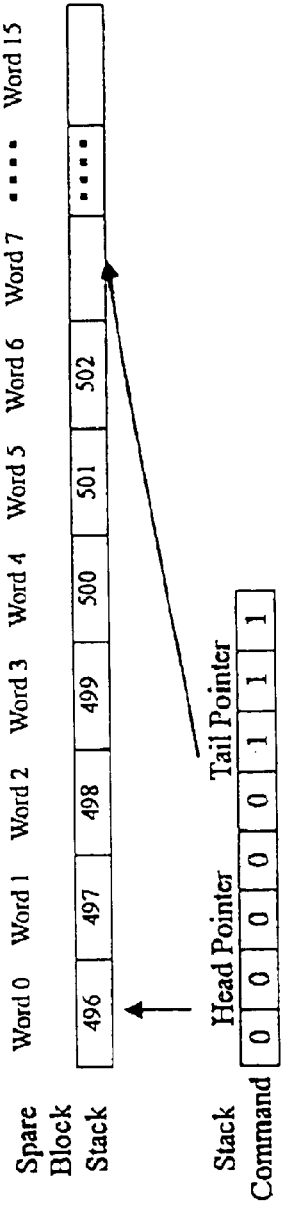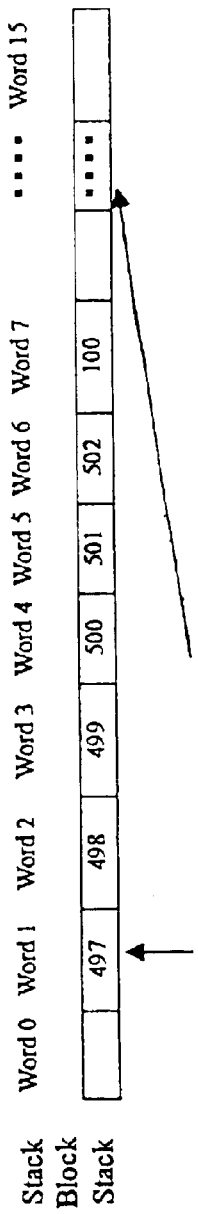

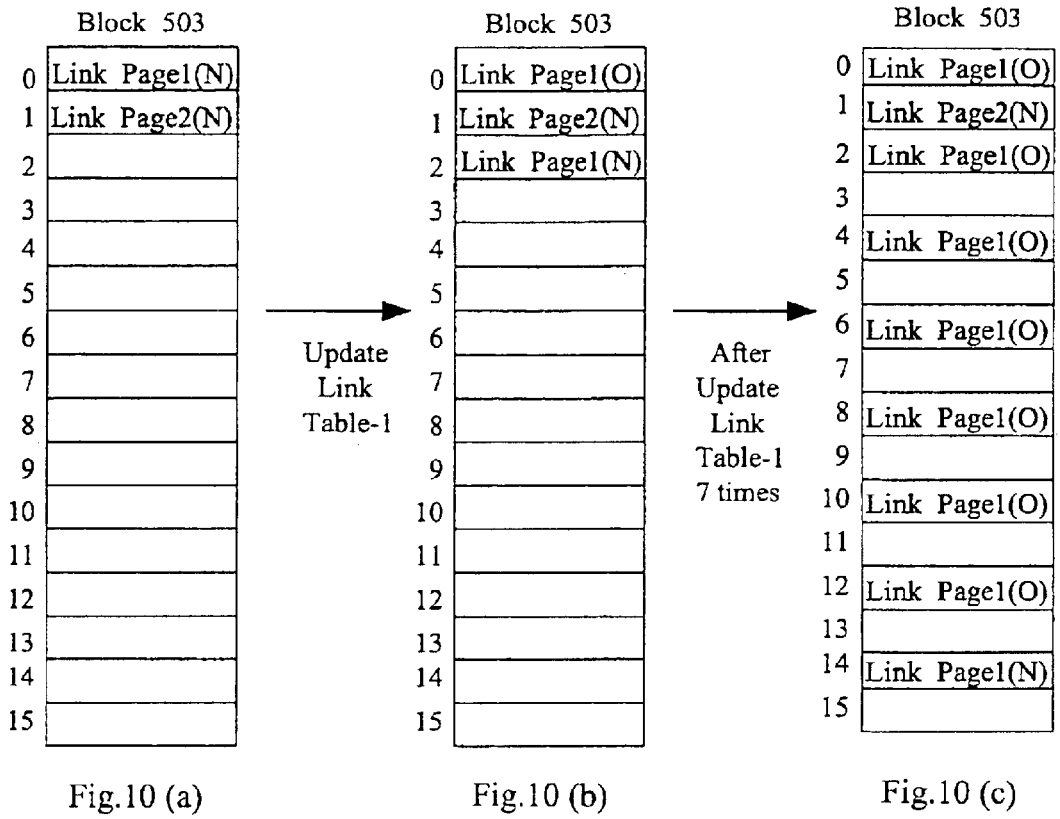
Fig.10 (a)    Fig.10 (b)    Fig.10 (c)
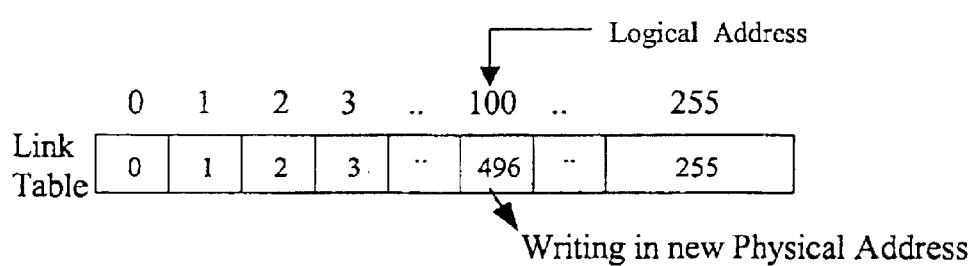
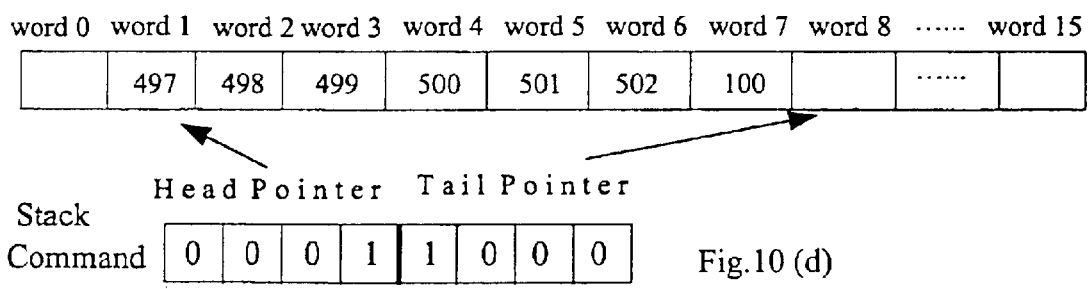
Fig.10 (d)

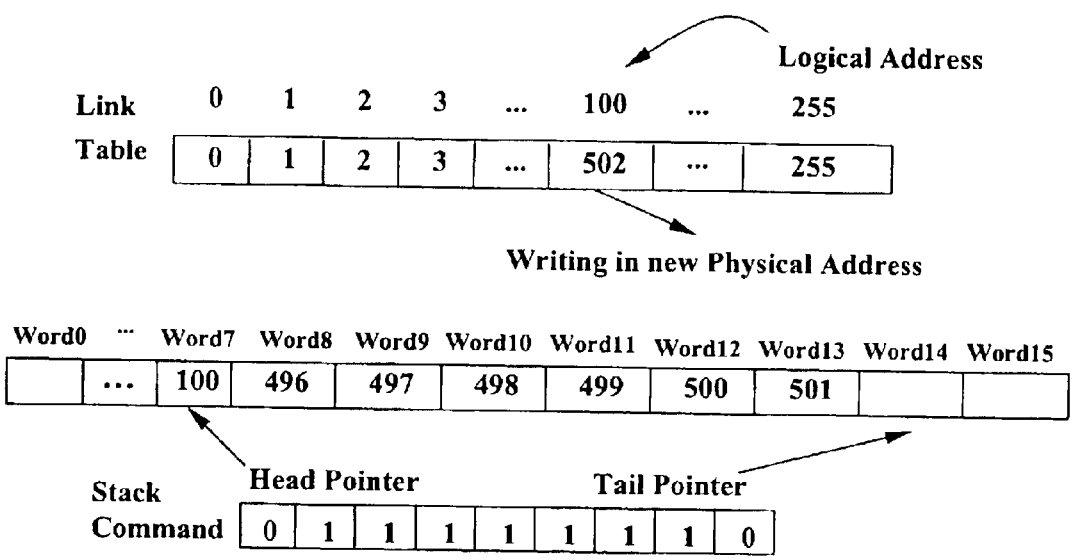
Fig.10 (e)
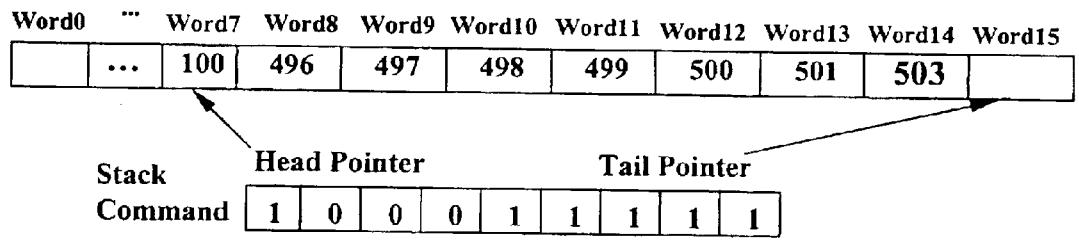
Fig.10 (f)
Block 100
| 0 | Link Table-1(Updated) |
|---|---|
| 1 | Link Table-1(Updated) |
| 2 | |
| ⋮ | ⋮ |
| 14 | |
| 15 | |
Fig.10 (g)

| Logical Address | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| Physical Address | 0 | 1 | 2 | 3 | 4 | 5 | 6 | 7 | 8 | 9 | 10 | 11 | 12 | 13 | 14 | 15 |

Fig. 11

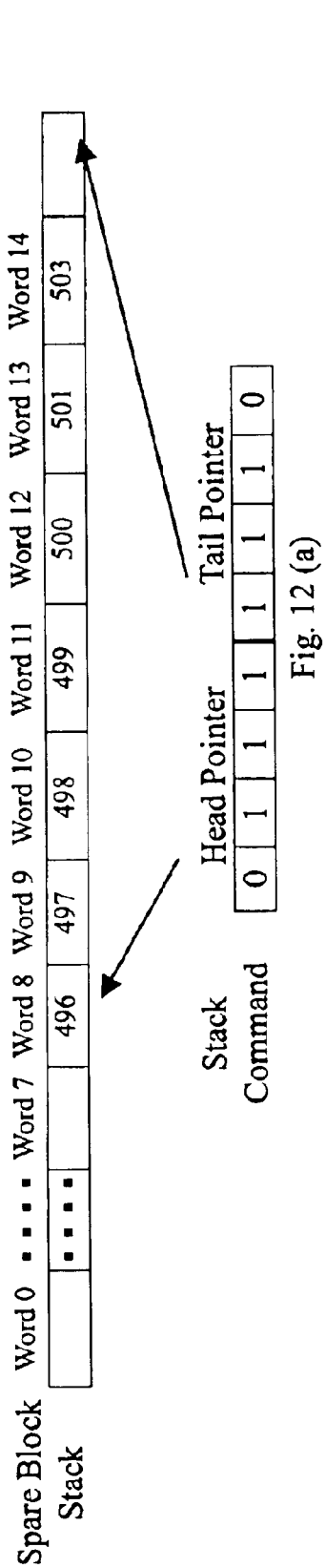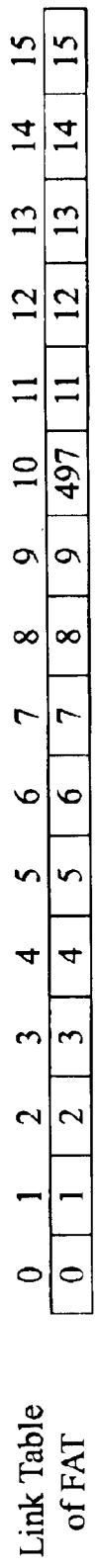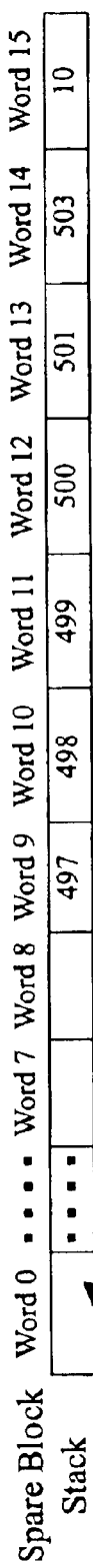
Fig. 12 (a)
Fig. 12 (b)
Fig. 12 (c)

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| 1 | 1 | 0 | 0 | 0 | 0 | 0 | 0 | 0 | 0 | 1 | 1 | 1 | 1 | 1 | 1 |

Fig. 14

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| 0 | 0 | 1 | 1 | 1 | 1 | 1 | 1 | 1 | 1 | 0 | 0 | 0 | 0 | 0 | 0 |

Fig. 15

| Beginning position | Position not used for data writing |
|---|---|
| 0 | 0x0000 |
| 1 | 0x0001 |
| 2 | 0x0003 |
| 3 | 0x0007 |
| 4 | 0x000F |
| 5 | 0x001F |
| 6 | 0x003F |
| 7 | 0x007F |
| 8 | 0x00FF |
| 9 | 0x01FF |
| 10 | 0x03FF |
| 11 | 0x07FF |
| 12 | 0x0FFF |
| 13 | 0x1FFF |
| 14 | 0x3FFF |
| 15 | 0x7FFF |

Fig.17 (a)

(End position=Beginning+Data Number-1)

| End position | Position possible to be used for data writing |
|---|---|
| 0 | 0x0001 |
| 1 | 0x0003 |
| 2 | 0x0007 |
| 3 | 0x000F |
| 4 | 0x001F |
| 5 | 0x003F |
| 6 | 0x007F |
| 7 | 0x00FF |
| 8 | 0x01FF |
| 9 | 0x03FF |
| 10 | 0x07FF |
| 11 | 0x0FFF |
| 12 | 0x1FFF |
| 13 | 0x3FFF |
| 14 | 0x7FFF |
| 15 | 0xFFFF |

MANAGEMENT, DATA LINK STRUCTURE AND CALCULATING METHOD FOR FLASH MEMORY

BACKGROUND OF THE INVENTION

The present invention is directed to management, a data link structure and a calculating method for a flash memory, and especially to establishment of a corresponding relationship between a logic block address and a real access address in order to ensure completeness in a data link. Furthermore, the invention provides protection against power failure to protect the data link structure and improve stability in use of the flash memory.

A flash memory is a semiconductor storage device which features high storage capacity per unit density, high write speed, and easiness to carry about. It is very suitable for communication apparatuses with light weight and small dimensions. In addition, it is possible to retain data without use of a battery, and therefore, flash memories have become accepted by users in a short period of time. However, the flash memory has some shortcomings, such as a restricted erase/program frequency. According to the specifications of the flash memory, normal operation of a block (8192 bytes—the smallest unit for easy operation of the flash memory) will not be able to be ensured if the erase frequency exceeds 1 million times.

Therefore, in view of the erase frequency restriction, the design of a better calculating method and data link structure, which is able to allot the erase/program frequency evenly to each block without any influence on the speed of data access and operation, and to ensure the completeness in data access, would be desirable. How to meet all the requirements mentioned above at the same time has been a tough task for firmware designers of flash memories.

SUMMARY OF THE INVENTION

The major object of the present invention is to provide a data link structure and calculating method for a flash memory so that the flash memory will be able to be used effectively. The data link structure and the calculating method are inseparable. The invention provides for division of the flash memory, establishment of the data link structure, management and paging of a spare block, and write procedures in the flash memory so that the time for data searching and data writing can be saved effectively, and so that the service life of the flash memory may be prolonged.

BRIEF DESCRIPTION OF THE DRAWINGS

FIG. 1 is a schematic diagram of a preset block division of a flash memory of the present invention in factory;

FIG. 5 is a schematic diagram of the basic structure of the blocks in the present invention;

FIGS. 9($a$)–9($d$) are schematic diagrams of updating internal data in a link-table of the present invention;

FIGS. 10($a$)–10($g$) are schematic diagrams of updating a link-table block, a link block, a link page and a spare block stack after data updating in a link table;

FIG. 11 is a schematic diagram of a FAT link table established by firmware after system starting when the system is not in use;

FIGS. 12($a$)–12($c$) are schematic flow diagrams for data writing in FIG. 11;

FIG. 14 is a schematic diagram of values of a move index;

FIG. 15 is a schematic diagram of values of a write index;

FIGS. 17($a$)–17($b$) are data tables established based on the concept in FIGS. 16($a$)–16($c$);

FIG. 18 is a diagram of resulting values obtained through XOR calculation of data in FIGS. 17($a$)–17($b$);

DESCRIPTION OF THE PREFERRED EMBODIMENTS

Referring to FIG. 1, it is a schematic diagram of preset block division of a flash memory of the present invention in the factory. During management of the flash memory, the present invention divides applicable blocks in the flash memory into four sorts. These four types of blocks are data blocks, a link-table block, spare blocks, and a new block. The four sorts of blocks may be classified as explicit and implicit. The data blocks are explicit, and the spare blocks, link-table block and new block are implicit. The explicit blocks are those with which direct data access can be performed by the logic addressing mode from the mainframe or computer side; conversely, direct data access cannot be performed with the implicit blocks by the logic addressing mode from the computer side.

The definition of the explicit/implicit blocks indicates that the data blocks have the function of storing data which are keyed from the computer side into the flash memory, and the new block, link-table block, and spare block are used to store data needed by firmware in order to meet the requirements of the data link structure.

In addition to the blocks shown in FIG. 1, there is another sort of block which is never to be used and is called defect block. As soon as a defect occurs in any sort of block of the flash memory, the defective block will be indicated by the culculating method of the present invention as a defective block which will never be used.

With the exception of new blocks, the other three sorts of blocks will have a different block allocation from that shown in FIG. 1 when the flash memory is used; it will be a random allocation. That is, allocation of the blocks will not be restricted within the range shown in FIG. 1. For example, the data blocks may be located at addresses-490–510 (this region belongs to the scope for spare blocks and the link-table block when division is preset). For the link-table block and the spare blocks the same condition will also occur, however, so the total number of various blocks will not change. Except for new blocks, the quantity of blocks will decrease gradually as the number of defective blocks increases. As soon as a new block becomes a data block, a spare block or a link-table block, it will never become a new block again.

Management of spare blocks is set up over three structures, such as a spare block stack, a head-pointer and a tail-pointer. The spare block stack provides a space for 16 words which is used to store the addresses of all spare blocksin the flash memory. The head-pointer and the tail-pointer are stored in a 8 bit stack pointer occupying 4 bits for each. The head pointer points to the first spare block in the spare block stack, and this is a block ready to be used. The tail-pointer points to the first blank position after all spare blocks in the spare block stack, and it is ready to be used to store a new spare block.

Figure 2:
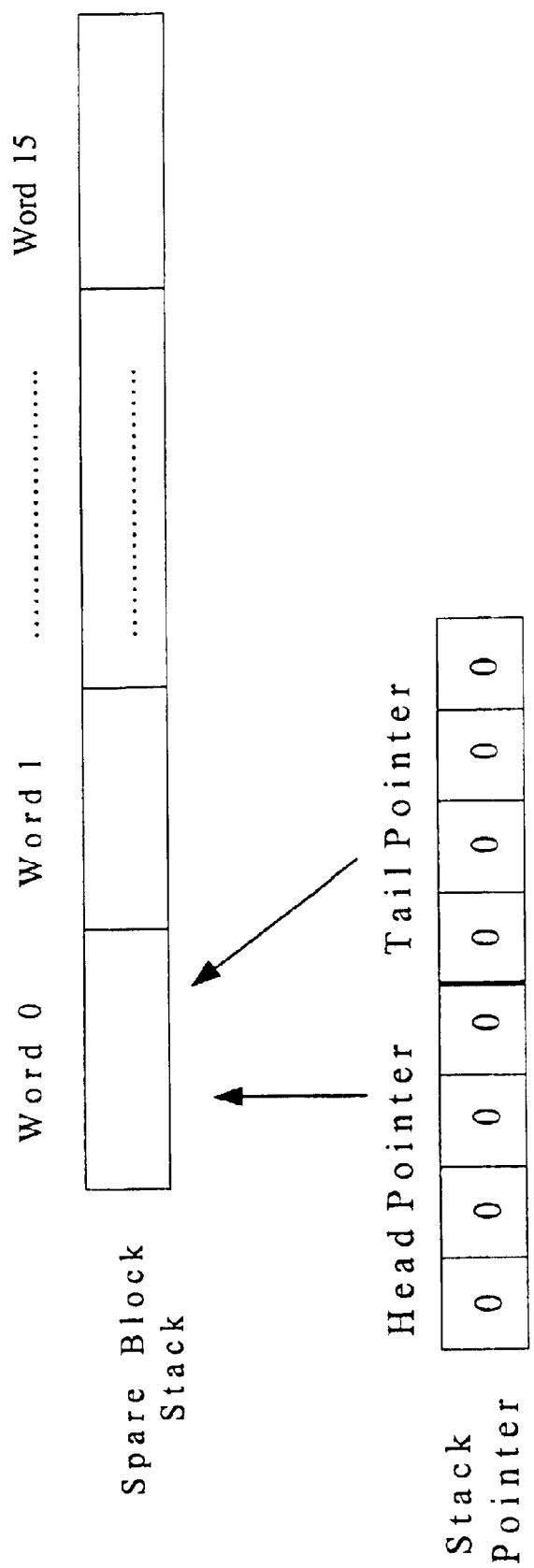
FIG. 2 is a schematic diagram of blank spare block stacks.

A blank spare block stack is shown in FIG. 2, in which 16 words have no data stored, and the head-pointer points to a position "0".

Figure 3:
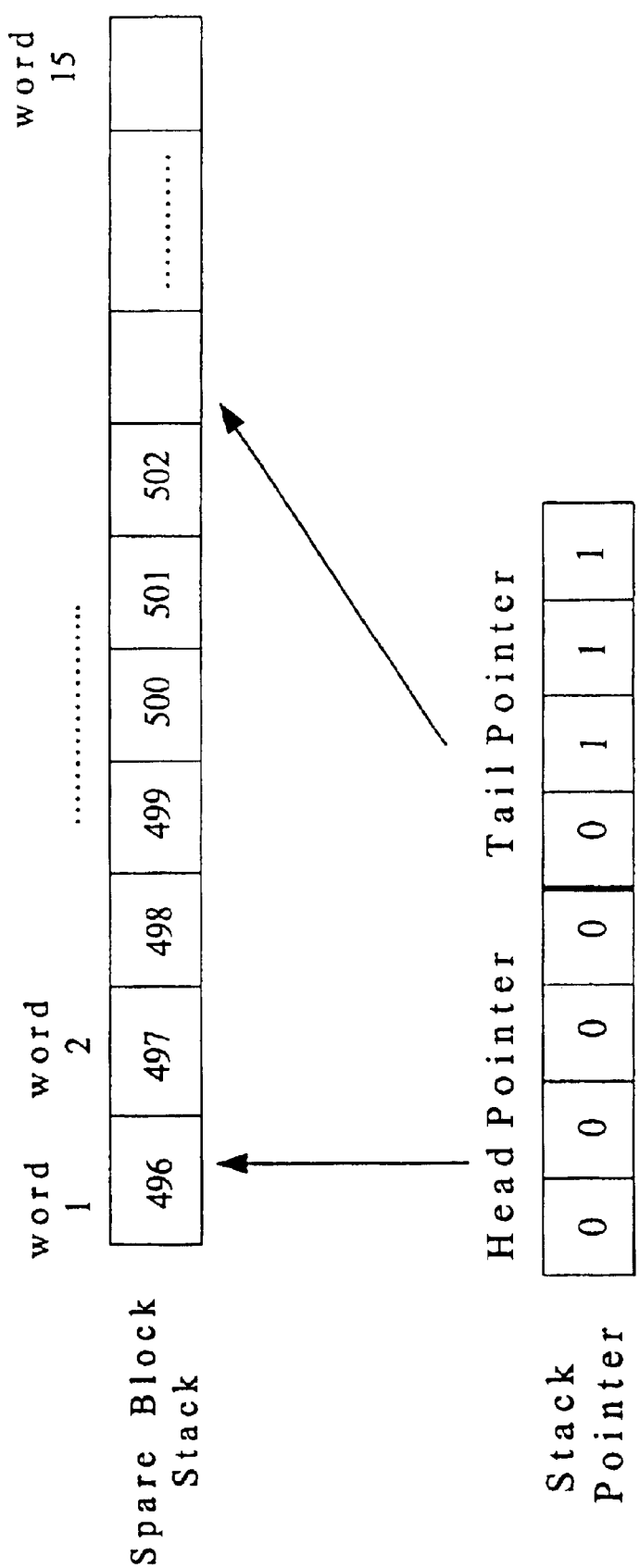
FIG. 3 is a schematic diagram of a spare block stack implemented by firmware after turning on a computer, taking an un-used 4 MB flash memory as an example.
Figure 4:
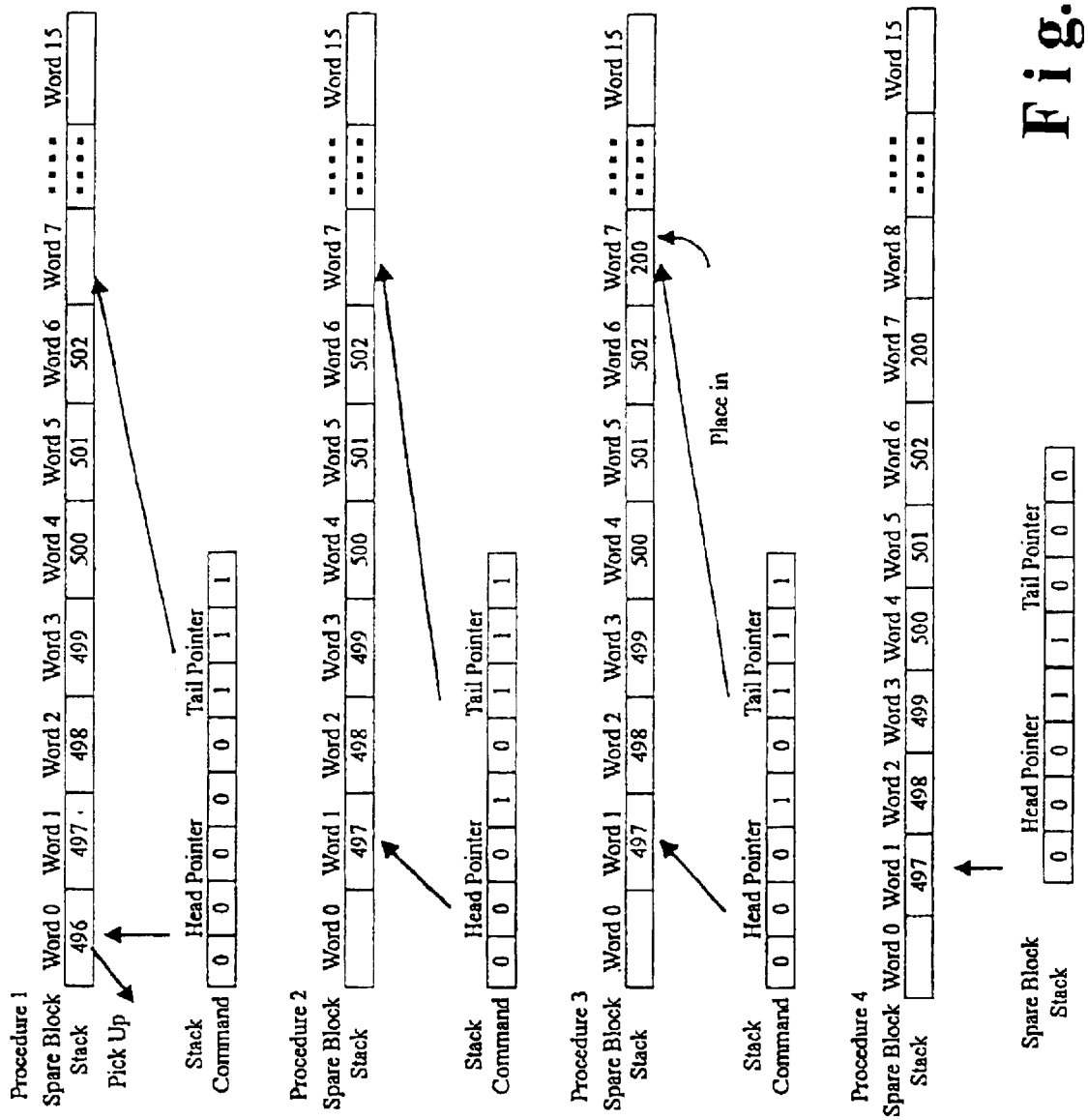
FIG. 4 is a flow chart of management/calculation procedures for spare blocks.

FIG. 3 shows an un-used 4 MB flash memory in which the addresses of the spare block stack and the spare blocks established by firmware are "496", "497", "498", "499", "500", "501", "502" respectively, and the head-pointer points to the stack address "0", and the tail-pointer points to the stack address "7". FIG. 4 shows management/calculation procedures for taking a spare block and substituting the block-200 (-200 means its address is located at 200), for example as follows:

Procedure 1. Picking up from the stack region the spare block which is pointed to by the head pointer (the picked up spare block is block-496).
Procedure 2. Adding "1" to the value of the head pointer, pointing to the next spare block ready to be picked up.
Procedure 3. Erasing the block to be substituted (-200), and then placing it in the position which is pointed to by the tail pointer.
Procedure 4. Adding "1" to the value of the pointer, pointing to the next blank position ready to store a new spare block.

When any block is found to be defective, management of defect block will commence. At first, a first new block is taken to substitute the block, then the block is marked as a defective block which will never be used.

FIG. 5 is a schematic diagram of the basic block structure of the present invention. A block contains 16 pages. Each page includes 512+16 bytes, in which 512 bytes on the lefthand side are called the data region, and 16 words on the righthand side are called the spare region. Data which are stored in the data region include general files of users, a file allocated table (FAT) and a link table, in which the users' data and the FAT are keyed in the flash memory from the computer and are stored in the data block. The link table is stored in the link-table block and is used to record the link relationship between the logic block and the actual block. In the spare region, error control codes and identification codes are stored. The error control code functions to improve the safety of data, and the identification functions to make the firmware recognize the block sort from the four sorts of blocks.

Based on the data access relationship, the present invention defines two types of blocks as original blocks and substituted blocks respectively. An original block is an actual block which is found to be able to store data by means of the designated logic block by the computer refering to the link-table; a substituted block is a block which is picked up from the spare block stack and is ready to be used to substitute for the original block.

Figure 6:
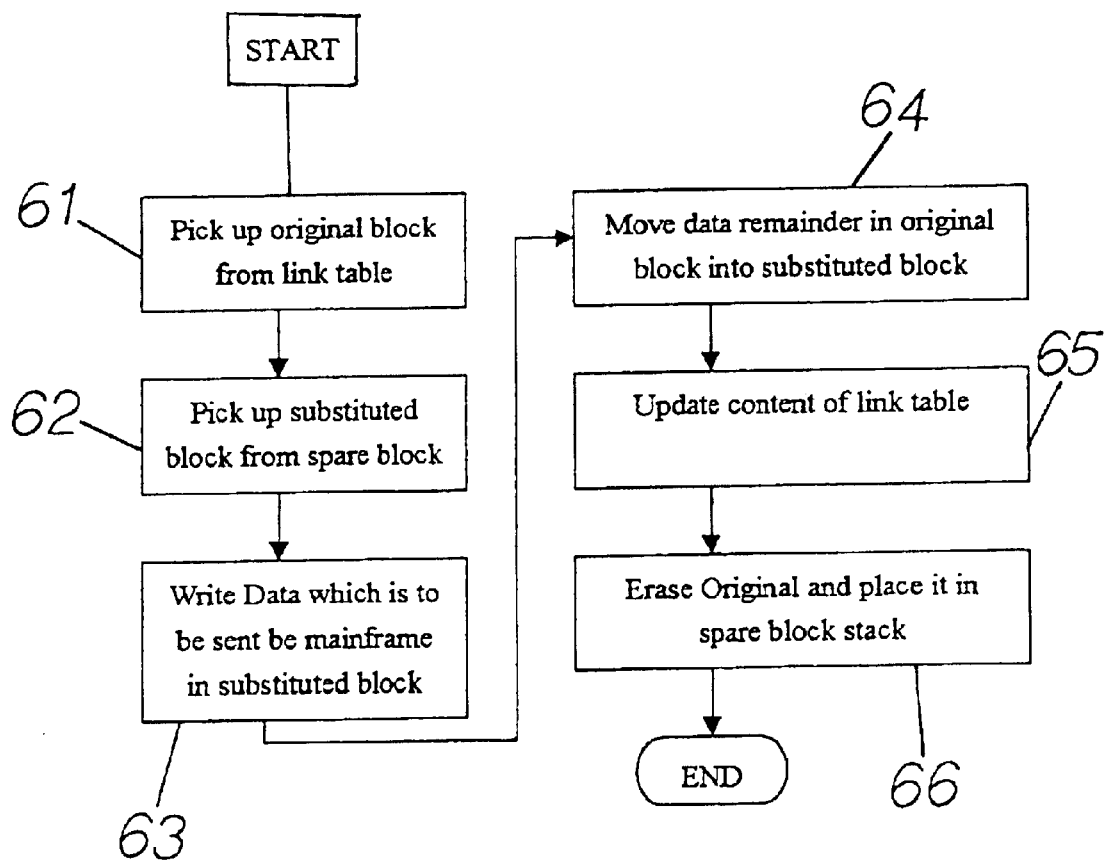
FIG. 6 is a flow chart of data writing of the present invention.

A flow chart of data writing of the present invention is shown in FIG. 6. At first, an original block shall be found out from the link table (Procedure 61), and then, the substituted block shall be found out from the spare block stack (Procedure 62), in order to substitue the data which are sent from the computer side and stored in the original block (Procedure 63). When all data from the computer side are written in the substituted block, the un-updated page data which remain still in the original block will be moved in the substituted block (Procedure 64), for the block to which the logic block corresponds actually has become a substituted block and the content in the link table must be updated (Procedure 65), in order to obtain complete data when next data access is performed from the computer side. After the content in the link table is updated, the original block will be erased and placed in the spare block stack for later use (Procedure 66).

The present invention classifies the data from the computer side as file allocation table and general data, which have two different link structures. However, they have a same fundamental concept with regard to the structure.

The link structure for the general data is a most important factor to ensure data completeness. The present invention operates to simplify the structure as well as to ensure data completeness, and through the data writing calculation, to divide the total write/erase frequency evenly among all the blocks. The data link structure consists of a link block, a link page and a link table by which a fast data search is able to be performed, and data reading completeness can be ensured.

The link table is stored in the link-table block; therefore, it exists actually in the flash memory and is used to record the link relationship between the logic address and the actual address. The link block and the link page, when the system turns on, is set up by the firmware according to all actual addresses at which the link table locates (i.e. addresses of the link table block), and is then stored in a memory which is provided in a microcontroller.

The link block is used to record all link-table block addresses.

The link page is used to record page positions of the link-table in the link-table block. By means of them, the position of the link-table in the flash memory may be defined.

Figure 7:
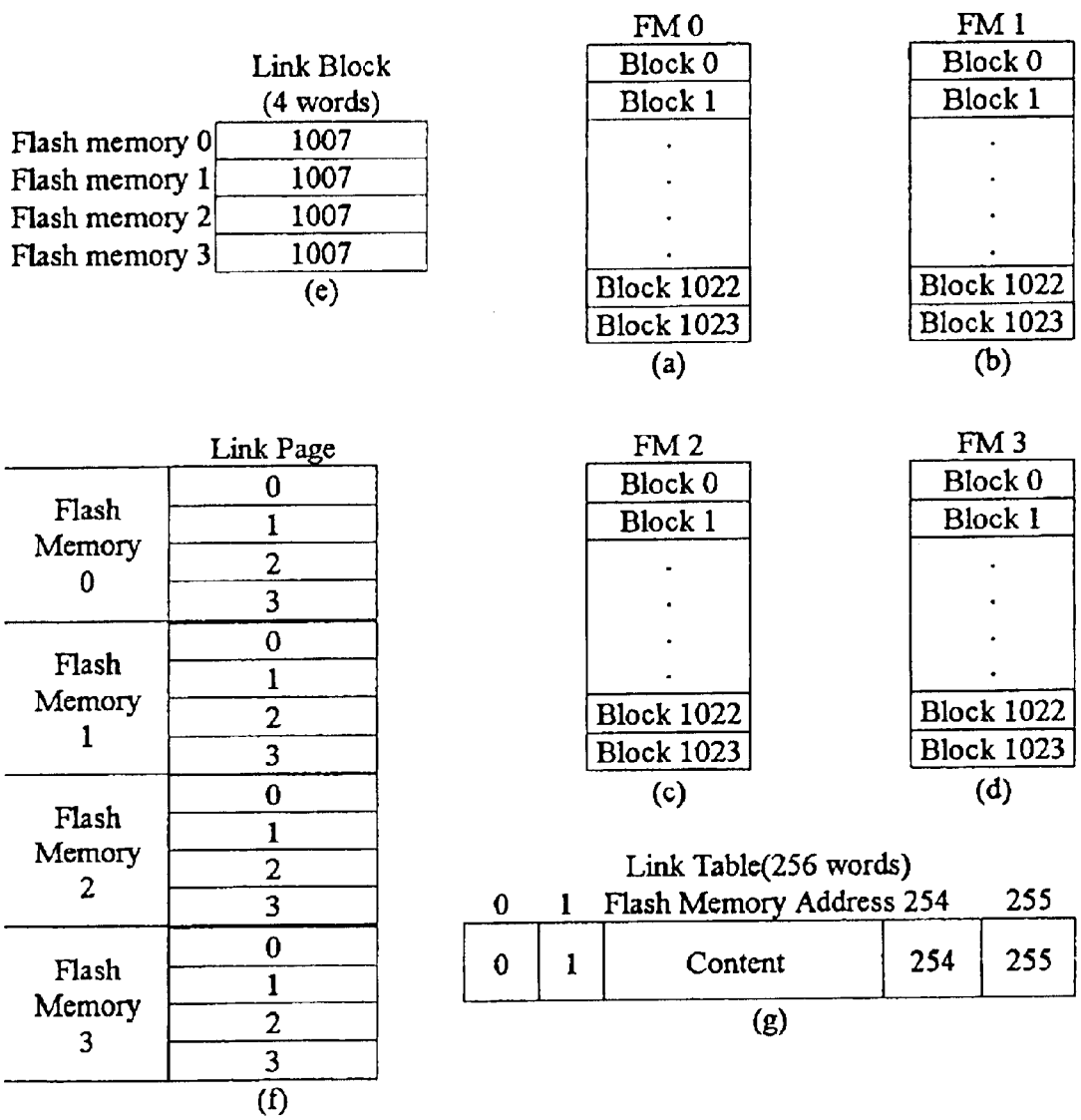
FIG. 7 is a schematic diagram of a structure of the present invention, taking an embodiment with four 8 MB flash memories as an example.

Taking four unused 8 MB flash memories for example as shown in FIG. 7, in which Items (a), (b), (c), and (d) indicate the four 8 MB flash memories respectively, each flash memory contains 1024 blocks. Item (e) in FIG. 7 indicates a link block, and because there are four link-table blocks in the four flash memories, they shall be recorded with four words. Item (f) in FIG. 7 indicates a link page, and since each flash memory contains 1024 blocks, and each page includes 512 bytes only, four pages shall be used for each flash memory to record the link relationship between the 1024 actual addresses and the logic addresses. Item (g) in FIG. 7 indicates a link table for which a recording mode of the address of a flash memory corresponding with the content at that address is accepted, the address of the flash memory standing for the logic address and the content standing for the actual address. Taking Item (g) in FIG. 7 for example, the actual access position for the logic address-0 is at the block-0. Because the flash memories shown in FIG. 7 are un-used, the addresses of the link-table blocks are all 1007, the link pages are 0, 1, 2, 3 respectively, the logic addresses are just the actual addresses, and the link table is as shown in FIG. 7(*g*).

Figure 8:
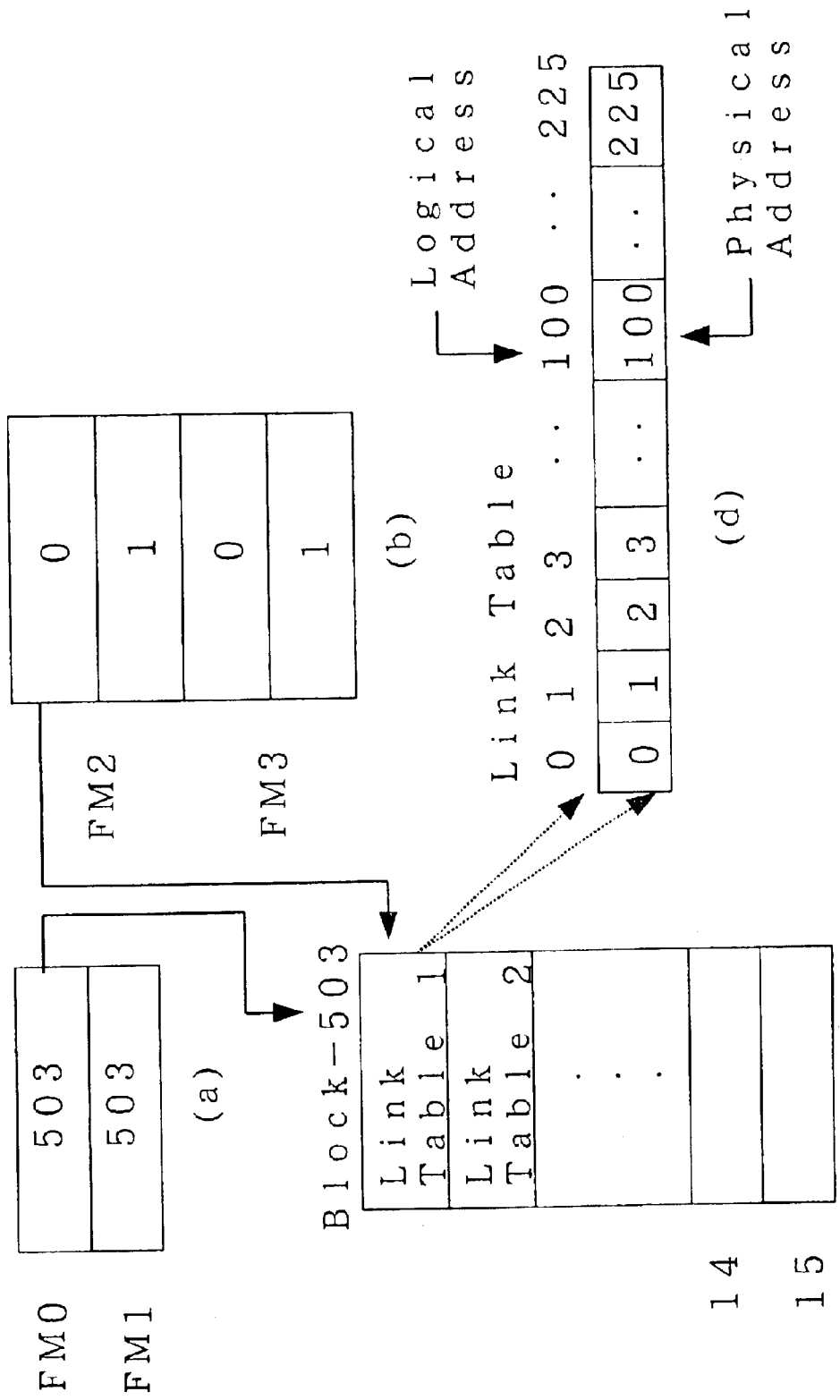
FIG. 8 is a schematic diagram of usage between link blocks, link pages and link-table blocks, taking two 4 MB flash memories as an example of an embodiment of the present invention.

FIG. 8 shows usage between link blocks, link pages and link-table blocks, taking two 4 MB flash memories for example. Provided access of the logic address-100 is expected on the computer side, through calculation by means of the calculating method it is found that the address is located at the flash memory 0 and the page address is located at the position 0 in the link page. From FIG. 7(*a*), the link-table block is located at the block-503, and from FIG. 8(*b*), the content of the position 1 in the flash memory 0 points to the page-0. So, through the link block and the link-table page it is able to be defined that the link table to which the block-100 belongs is located at the page-0 of the block-503, as shown in FIG. 8. From FIG. 8(*d*) it is found that data at the logic address-100 is stored in the block-100.

FIGS. 9(*a*)–9(*d*) are schematic diagrams of updating internal data in the link table. FIG. 9(*a*) shows an original link table. When data which are stored at the logic address-100 are expected to be read from the mainframe side, it is determined from the link table that the data is stored in the block-100 where the data can be read. If data are expected to be written in the logic address-100, then the block-496, which is pointed to by the head pointer (as shown in FIG. 9(*b*)), shall be picked up from the spare block stack. Then the block-100 is substituted by the block-496 into the logic address-100 in the link table (as shown in FIG. 9(*c*)). Finally, the block-100 is placed in the spare block stack (as shown in FIG. 9(*d*)).

FIGS. 10(*a*)–10(*g*) are schematic diagrams of updating the link-table block, link block, link page and spare block stack after data updating in the link table. Taking a single 4MB flash memory for example, in the block-503 there are two link tables which are in the page-0 and the page-1 respectively. It is supposed that the link table of the page-1 has been updated, and the new link table will be stored in the page-3. After the link table is updated seven times, data in the block-503 will have a distribution as shown in FIG. 10(*c*). If the link table is updated again, a block will be picked up from the spare block stack to substitute for the block-503, and the updated link table will be written in the block and the un-updated data in the block-503 will be moved in the block-496, as shown in FIG. 10(*g*).

As the file allocation table uses the same link structure (link table, link block and link page) as that for general data, a high update frequency of the file allocated table will cause service life of the flash memory to be shortened. Therefore, the present invention processes the file allocated table and general data separately, and provides a design of a simpler structure which is suitable to the file allocated table.

Such a link structure contains only a singly table—a FAT link table. The FAT link table is used to record the actual blocks to which logic blocks from -0 to -15 correspond. With establishment of the table, the link block and the link page, based on the identification codes which are stored in the spare region of each block when the system turns on, the FAT link table is set up.

FIG. 11 shows a FAT link table established by a firmware after system starting when the system is not in use. It is supposed that the logic address-10 is expected to be updated from the mainframe sidereferring. Referring to FIG. 11, the data are stored in the block-10.

As shown in FIGS. 12(*a*)–12(*c*), FIG. 12(*a*) shows the current status of the spare block stack. Therefore, when the block-496 is picked up as a substituted block to substitute for the block-10 and an identification code is filled in the spare region of the block-496 and all data are written in the block-496, the FAT link table will be updated (as shown in FIG. 12(*b*)). Then the block-10 is placed in the spare block stack, and the final spare block stack will be as shown in FIG. 12(*c*).

Figure 13:
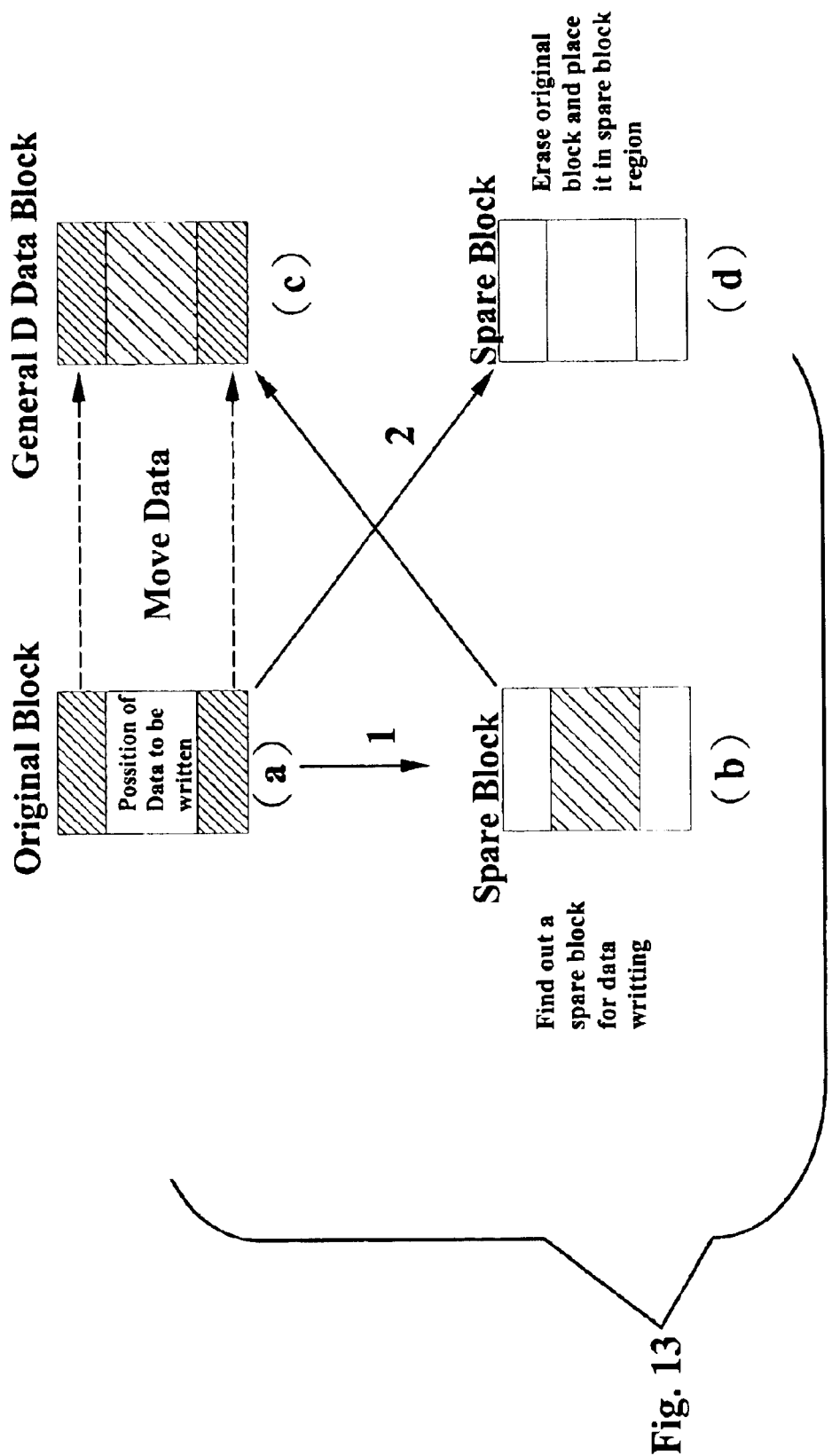
FIG. 13 is a schematic diagram of moving a data remainder in original blocks following writing data in FIGS. 12($a$)–12($c$) in to substituted blocks.

It is found out from the process of data writing mentioned above that in order to complete block writing, the data on the computer side and the un-updated page in the original block shall be processed. So, in substitution between the original block and the substituted block there is a latent problem, i.e. the un-updated page in the original block shall be written in the substituted block before the original block is erased. Therefore, following the writing of new data into the substituted block, moving of data remaining in the original block shall be carried out (as shown in FIG. 13).

The calculating method of the present invention is able to be used to establish a move index, through which the page that will be moved from the original block to the substituted block can be determined. The move index has a length of 16 bits, each bit corresponding with a page. It is determined according to the value of a bit if a page to which that bit corresponds shall be moved or not. For example, "1" stands for Yes, "0" stands for No. Provided that pages which will be expected to be moved include 3 pages 0–5 and 14–15, the values in the move index are shown in FIG. 14.

The basic principle of evaluation of the move index is that by utilization of data on the computer side (beginning address and data quantity), all page positions where writing is expected to be performed can be determined so that what remains are pages which shall be moved. The write index in the present invention has the same definition as that for the move index. I.e., "1" means the bit which corresponds with the page that will be expected to be written, and otherwise, a value of "0" will be present. Provided that the pages which are to be written include pages from 6 to 13, the write index will be as shown in FIG. 15. If a write index is in its opposite status, a move index may be obtained (for example, FIG. 14 is the opposite status or compliment of FIG. 15).

Figure 16:
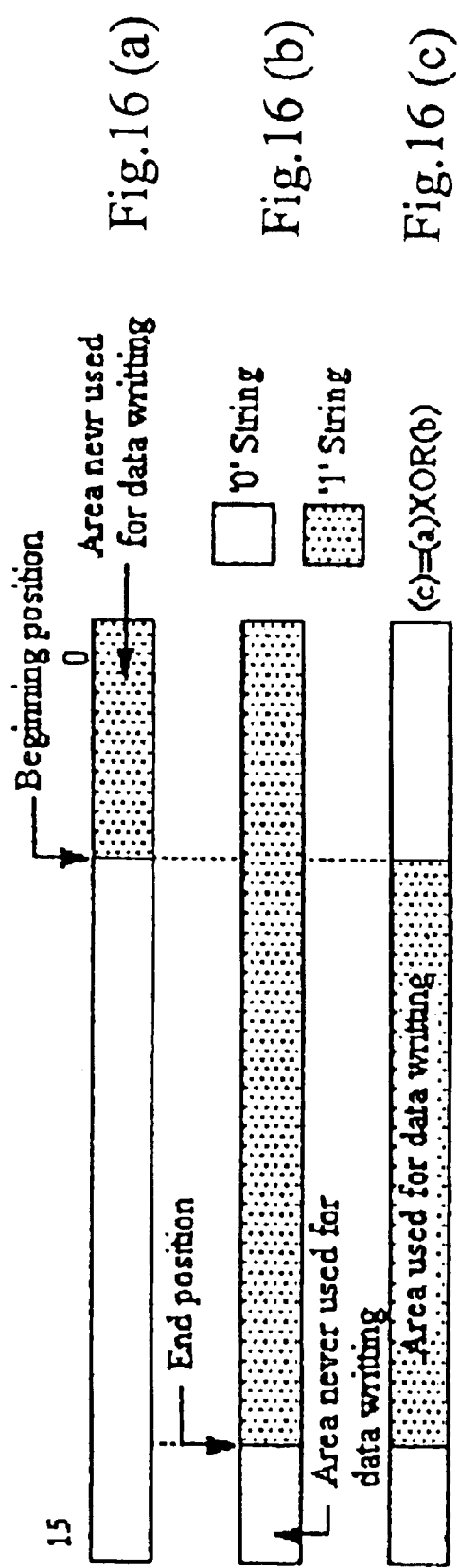
FIGS. 16($a$)–16($c$) are conceptual diagrams of write index determination.

FIGS. 16(*a*)–16(*c*) are conceptual diagrams for write index determination.

FIGS. 17(*a*) and (*b*) corresponds to FIGS. 16(*a*) and (*b*) respectively.

The diagrams in FIGS. 17(*a*) and (*b*) are established based on the given data (beginning position, page number) from the computer side and the concept in FIGS. 16(*a*)–16(*c*).

Figure 18:
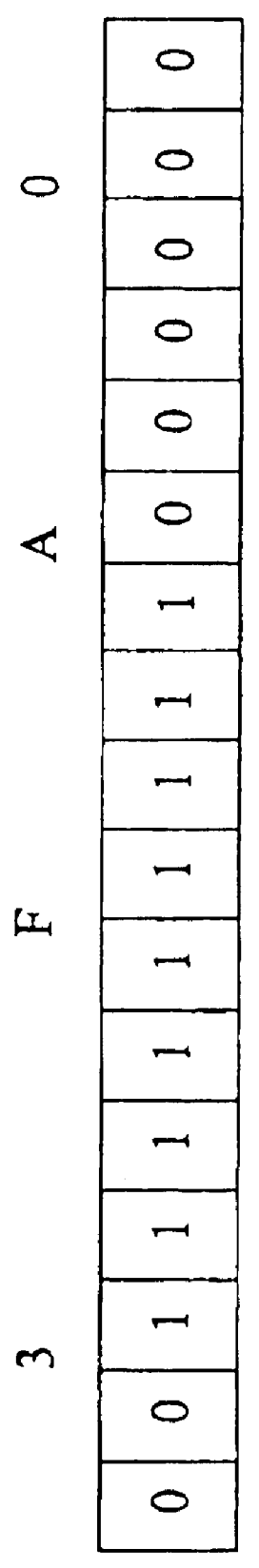

It is supposed that the beginning position of data writing is 6, and the number of pages is 8, so the ending position will be 13. The values of 0x003F and 0x0FFFF can be found from FIGS. 17(*a*) and (*b*), and then an XOR calculation of the two values is carried out. This results in (0x003F XOR 0x0FFF)=0x3FA0, as shown in FIG. 18, which has the same status as that in FIG. 15, and its opposite status will result in 0xA03F, i.e. the diagram in FIG. 14.

Furthermore, if more than 16 pages of data are expected to be sent, the positions where the data are to be written will be from the beginning position to the last page so that the write index will be the opposite values obtained from FIGS. 17(*a*) and 17(*b*). For example, if the beginning position where the data are to be written is 6 and the data occupy 16 pages, the refering to FIG. 17(*a*), the write index of 0xFFA0 will be obtained, and from its opposite value the move index of 0x003F may be gotten.

Figure 19A:
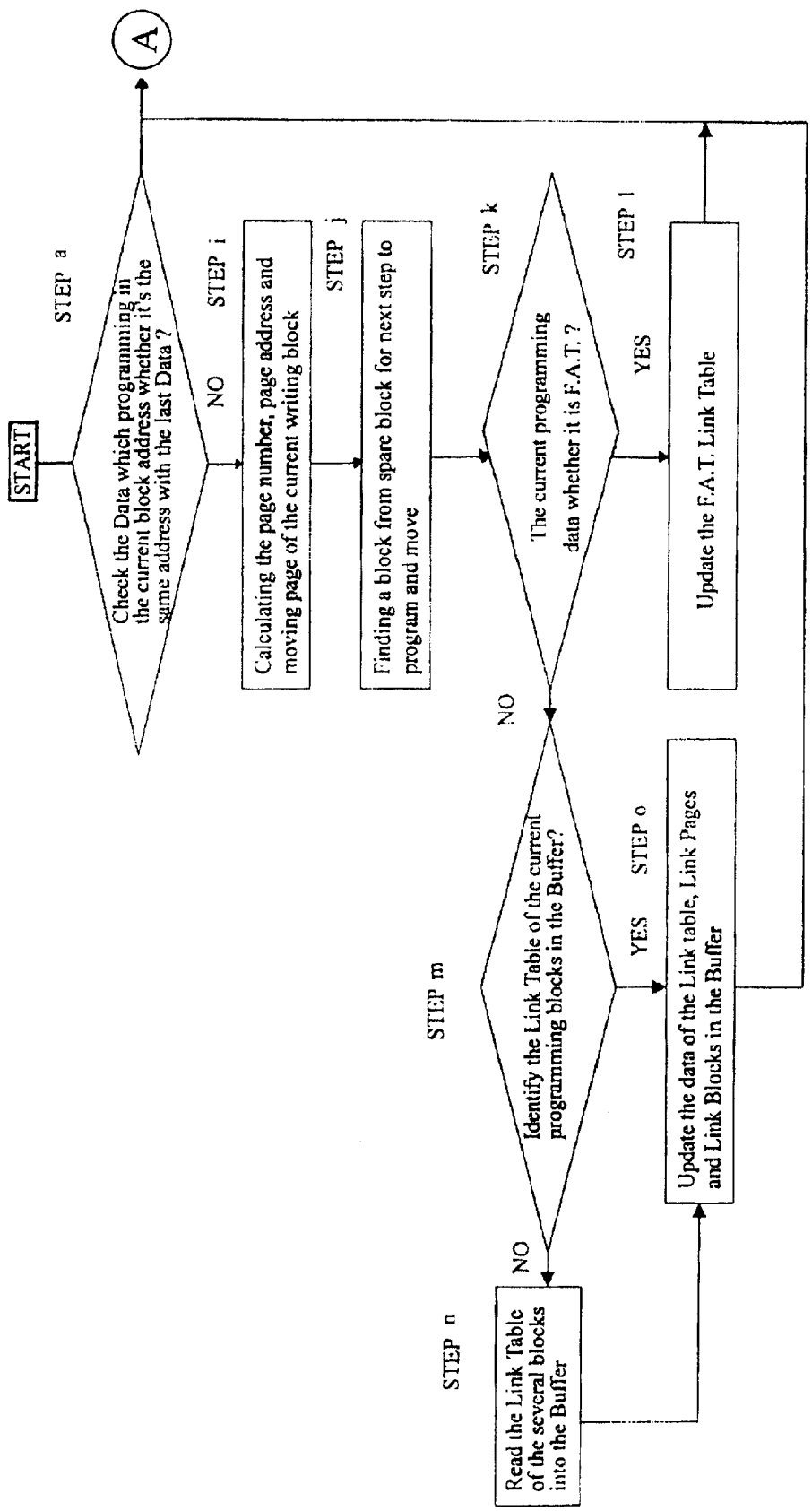
FIGS. 19A and 19B are a complete flow chart for writing a page of the present invention.
Figure 19B:
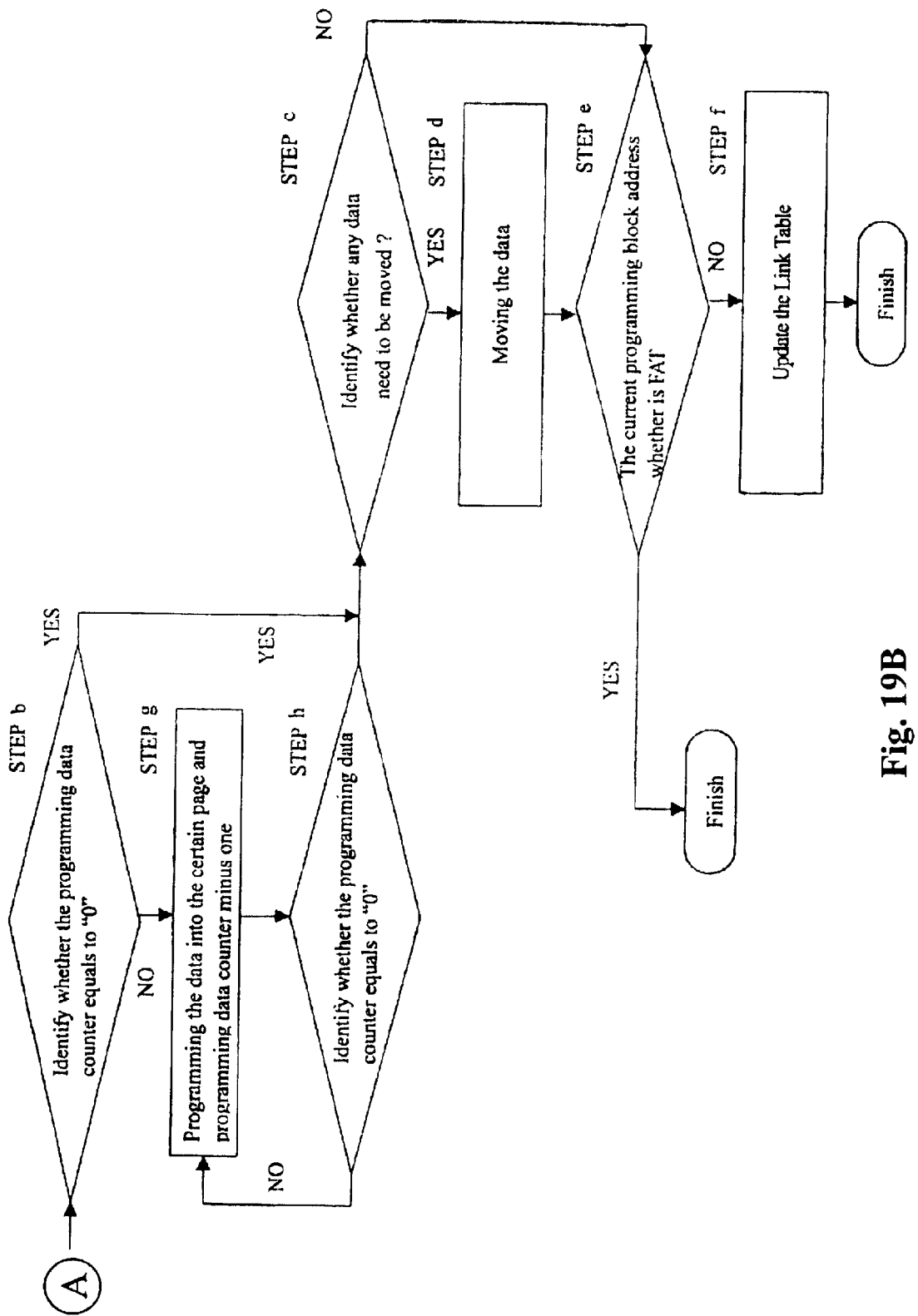

FIGS. 19A and 19B are a complete flow chart for writing a page in accordance with the present invention and include the following procedures:

Procedure a: When a batch of data is expected to be written from the mainframe, it will be determined if this batch of data and the previous batch of data belong to a same block, if yes, it will be not necessary to establish a move index again; otherwise, procedure i shall be carried out.

Procedure b: Determining if the number of data which are to be written is "0". If it is not "0", procedure g shall be performed.

Procedure c: As the data are ready to be written in that block from the mainframe, it shall be determined if there are data which shall be moved from the original block to the substituted block. If no, procedure e shall be carried out.

Procedure d: Moving the page which is designated by the move index into the substituted block.

Procedure e: Determining if the written data are a file allocated table. If yes, the page writing shall be ended; otherwise, procedure f shall be taken place.

Procedure f: Ending operation after the data link table is updated.

Procedure g: Writing data in the designated page and subtracting one from the number of data which are ready to be written.

Procedure h: Determining if the number of data which are ready to be written is "0". Performing procedure c as soon as data writing is completed; otherwise, returning to procedure g.

Procedure i: As the block where the data are to be written is a new designated block, based on the parameters from the mainframe side, the number of pages which are to be written in that block, the page beginning position and the pages which are to be moved shall be determined.

Procedure j: Picking up the substituted block that is pointed to by the head pointer from the spare block stack for writing the data from the mainframe and moving the data in the original block in that block.

Procedure k: Determining if the logic address which is to be written is the address for storage of the file allocated table. If yes, procedure l shall be performed; otherwise, procedure m shall be carried out.

Procedure l: Updating the content in the FAT link table in order to maintain completeness of data link, and returning to procedure b.

Procedure m: As the block which is be written is of a general block, a general data link structure (link table, link block and link page) shall be provided for it. This procedure is used to determine if the link table to which the logic block belongs exists in the buffer. If yes, procedure o shall be performed.

Procedure n: Reading the link table to which the logic block belongs in the buffer.

Procedure o: Updating the content of the link table which is stored in the buffer, and updating the contents in the link page and link block, and then returning to procedure b. If the block which stores the link table becomes full, a spare block will be needed for filling/moving the link table in the spare block, and the link data and the link page shall be updated.

As will be seen according to the above, the management, the data link structure and the calculating method of the present invention include dividing the flash memory into several different data access blocks and providing a simple data link structure, management and calculating method for the spare block in order to save time to search and write data effectively. Furthermore, the service life of the flash memory is prolonged.

The technique, figures, procedures or control etc. mentioned above are only an example to embody the present invention, and the range of the present invention is not restricted to them; any modification or change made based on the claims of the present invention shall be considered to be within coverage of the present invention.

What is claimed is:

1. A management and data link structure for a flash memory which is used to divide the flash memory into blocks with different functions, which include:

a plurality of generally data blocks by which direct data access can be performed by a computer;

a plurality of spare blocks which are used as back-ups for the general data blocks for storage of data from the computer which is to be written when repeated writing happens to the general data blocks which are addressed by the computer;

a link table block which is used to store a check list between actual locations in the general data blocks and logical locations addressed by the computer, and to ensure data correctness by interchanging of the logical locations and the actual locations;

a plurality of new blocks which are used as extensions of the general data, spare, or link table blocks, and as soon as a new block is incorporated into one of the general data, spare, or link table blocks it will never become a new block again; and defective blocks which arise when any of the general data, spare, link table, or new blocks is determined to be defective, the defective block being marked so that it will never be used again, wherein a management mode of the spare blocks is set up so as to provide a spare block stack, a head pointer and a tail pointer, the head pointer pointing to a first spare block which is ready to be used in the spare block stack and the tail pointer pointing to a first blank position after all the spare blocks, to be used to store a new spare block.

2. The management and data link structure for a flash memory according to claim 1, in which the data blocks are explicit blocks with which direct data access can be performed by a logical addressing mode by the computer.

3. A management and data link structure for a flash memory according to claim 1, in which the spare blocks, the link table block, and the new blocks are of implicit blocks with which direct data access cannot be performed by the computer, the implicit blocks being used to store data needed by firmware in order to support the data link structure.

4. A management and data link structure for a flash memory which is used to divide the flash memory into several blocks with different functions, which include:

a plurality of general data blocks by which direct data access can be performed by a computer;

a plurality of spare blocks which are used as back-ups for the general data blocks for storage of data from the computer which is to be written when repeated writing happens to the general data blocks which are addressed by the computer; and a link table block which is used to store a check list between actual locations in the general data blocks and logical locations addressed by the computer, and to ensure data correctness by interchanging of the logical locations and the actual locations, wherein writing procedures for the data blocks include:
  a. picking up a logical block designated by the computer, and finding out an original actual block which can be used to store data according to a link table in the link table block;
  b. picking up a substituted block from the spare block stack which is ready to be used to substitute for the original actual block;
  c. storing data from the computer in the substituted block;
  d. when all the data from the computer are written in the substituted block, moving un-updated page data which remain still in the original actual block to the substituted block;
  e. updating the content of the link table so that complete data is available when a subsequent access is performed by the computer; and
  f. erasing the original actual block and placing it in the spare block stack for later use.

5. A management, data link structure and calculating method for a flash memory, in which effective establishment of a data access link table function and updating of a management structure for spare blocks of the flash memory includes the following steps (a) through (o):
  (a) determining if the data written by a computer and a previous batch of data belong to a same block, and if yes, it will be not necessary to establish a move index again, and if otherwise, carrying out step (i);
  (b) determining if the number of data which are ready to be written is "0", and if not, performing step (g);
  (c) determining if there are data which shall be moved from an original block to a substituted block, and if not, carrying out step (e);
  (d) moving a page which is designated by the move index into a substituted block;
  (e) determining if the data which are to be written are a file allocation table and if yes, ending the page writing, and otherwise, performing step (f);
  (f) ending operation after the data link table is updated;
  (g) writing data in the designated page and subtracting one from the number of data which are ready to be written;
  (h) determining if the number of data which are ready to be written is "0", and if yes, performing step (c) as soon as data writing is completed, and otherwise, returning to step (g);
  (i) if the block where the data are to be written is a newly designated block, and based on parameters from the computers, determining the number of pages which are to be written in that block, the page beginning location, and the pages which are to be moved;
  (j) picking up a substituted block that is pointed to by a head pointer from a spare block stack for writing the data from the computer and moving the data in an original block in that block;
  (k) determining if the logic address which is to be written is the address for storage of the file allocation table, and if yes, performing step (c), and otherwise, performing step (m);
  (l) updating the content in a FAT link table, and returning to;
  (m) determining if the link table to which the logic block belongs exists in a buffer, and if yes, performing step (o);
  (n) reading the link table to which the logic block belongs in the buffer; and
  (o) updating the content of the link table which is stored in the buffer, and meanwhile, updating the contents in the link page and link block, returning to step (b), but if the block which stores the link table becomes full, using a spare block to store at least part of the link table and updating the link data and the link page.

* * * * *